United States Patent [19]

Roggwiller

[11] Patent Number: 5,017,992
[45] Date of Patent: May 21, 1991

[54] HIGH BLOCKING-CAPACITY SEMICONDUCTOR COMPONENT

[75] Inventor: Peter Roggwiller, Riedt-Neerach, Switzerland

[73] Assignee: Asea Brown Boveri Ltd., Baden, Switzerland

[21] Appl. No.: 490,288

[22] Filed: Mar. 8, 1990

[30] Foreign Application Priority Data

Mar. 29, 1989 [CH] Switzerland .................. 1141/89

[51] Int. Cl.⁵ .................. H01L 29/74; H01L 29/747
[52] U.S. Cl. ............................ 357/38; 357/39
[58] Field of Search ............. 357/38, 38 G, 38 L, 357/38 S, 38 T, 38 P, 38 A, 38 C, 38 E

[56] References Cited

FOREIGN PATENT DOCUMENTS

| 118336 | 9/1984 | European Pat. Off. . |
| 200863 | 12/1986 | European Pat. Off. . |
| 228107 | 7/1987 | European Pat. Off. . |
| 0228107 | 8/1987 | European Pat. Off. .......... 357/38 G |

OTHER PUBLICATIONS

"6000 V Gate Turn-Off Thyristor with n-Buffer and Anode Short Short Structure", 19th Conference on Solid State Device and Materials, Tokyo 1987, T. Ogura et al.

Primary Examiner—Rolf Hille
Assistant Examiner—Wael Fahmy
Attorney, Agent, or Firm—Oblon, Spivak, McClelland, Maier & Neustadt

[57] ABSTRACT

In the case of a high blocking-capacity semiconductor component with an anode structure, which provides between the n-type base layer (6) and the anode-side p-type emitter regions (8) an n-doped barrier layer (7), and between the p-type emitter regions (8) emitter short-circuits with short-circuit contact regions (9), by partitioning of the barrier layer (7) into local barrier-layer regions (7a,b) an easily adjustable and simultaneously increased short-circuit resistance ($R_s$) in the short-circuit path is obtained.

20 Claims, 2 Drawing Sheets

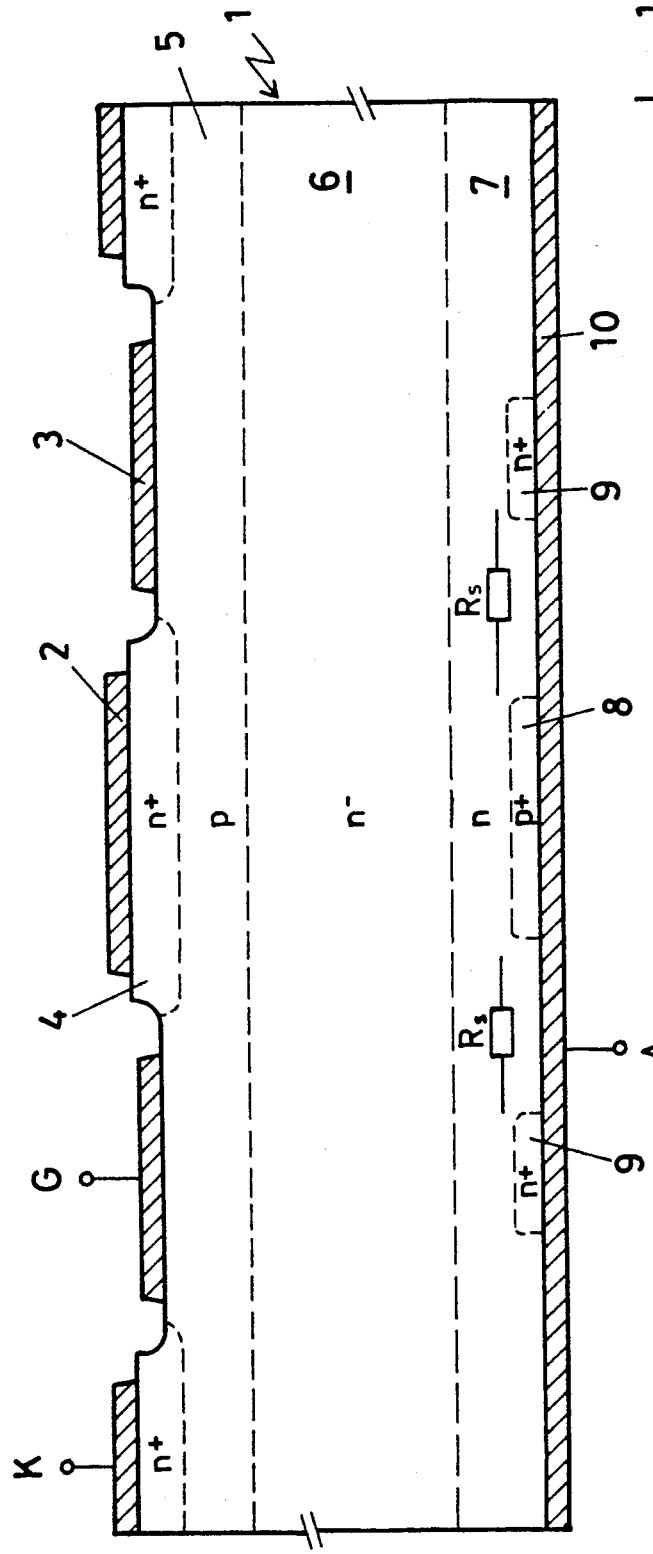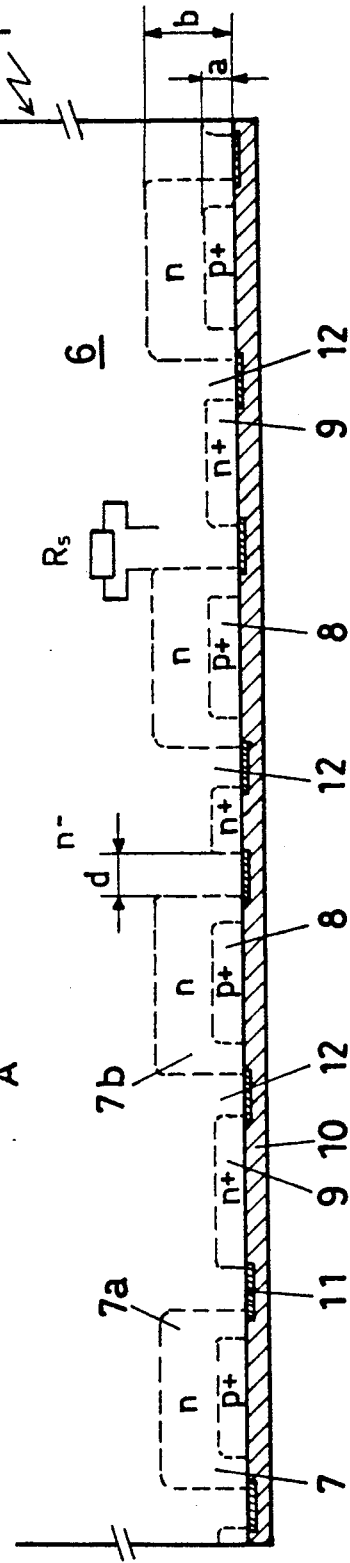
FIG.1
FIG.2

HIGH BLOCKING-CAPACITY SEMICONDUCTOR COMPONENT

BACKGROUND OF THE INVENTION

1. Field of the Invention

The present invention is concerned with the field of power electronics. It concerns in particular a high blocking-capacity semiconductor component, comprising (a) a semiconductor substrate;

(b) in the semiconductor substrate, between a cathode and an anode, a series of differently doped layers with an n-type base layer, a plurality of anode-side p-type emitter regions and a barrier layer arranged between n-type base layer and p-type emitter regions; and (c) a plurality of emitter short-circuits with short-circuit contact regions, which are arranged between the p-type emitter regions.

Such a component is well known from e.g. the article by T. Ogura et al. "6000 V Gate Turn-Off Thyristor with n-Buffer and new Anode Short Structure", 19th Conference on Solid State Device and Materials, Tokyo 1987.

DISCUSSION OF BACKGROUND

In order that a semiconductor component with a reverse-biasing PN-junction is able to block high voltages, an appropriate dimensioning with regard to the thickness and the specific resistance of the lower-doped layer is required.

This dimensioning is directed towards the two fundamental criteria that, on the one hand, the maximum electric field strength occurring at the PN-junction does not exceed a given value, and on the other hand the electric field does not reach the two main surfaces of the component. In the case of asymmetrical structures with constant doping of the higher-resistance layer, this leads to components with very large thickness and correspondingly high on-state resistance.

A way out of this unfavorable situation has been known for some time, in which the lightly-doped layer is terminated at its end by means of an additional, like-polarity but more highly doped layer (barrier layer). Thus the electric field strength is not allowed to decay until immediately before reaching the surface, whereby the necessary thickness of the component for the specified blocking voltage is roughly halved.

In principle the barrier layer structure is also suitable for switchable components such as GTOs, in order to reduce their thickness and hence obtain lower switching and transmission losses. But frequently these components are fitted on the anode side with so-called emitter short-circuits, which in combination with a field-limiting layer (barrier layer) lead to a massive degradation of the triggering characteristics.

The reason for this is that the increased conductivity, due to the more highly doped barrier layer immediately before the anode-side emitter, leads to a sharp reduction in the emitter efficiency. At voltages which are below the injection potential of the anode, a large electron current is conducted directly to the outer contact.

In order to reduce this effect to a level tolerable for the triggering sensitivity, either the lateral distances between the anode short-circuits must be made very large, or the relative portion of surface area very small. In both cases one loses a large part of the action of the short-circuits necessary for low-loss turn-off behavior. A variation, which for example provides small-area, cylindrical anode short-circuits in combination with a barrier layer for a 6 kV GTO, is described in the article by T. Ogura et al. cited above.

Another known anode structure dispenses completely with emitter short-circuits, but possesses such a highly doped barrier layer that the emitter efficiency can be reduced to a level necessary for good switching behavior. The disadvantage of this concept however, is that it is dependent on a particularly good homogeneity in the doping over the whole active component surface, since otherwise a non-uniform current distribution arises during the turn-off process, which is clearly one of the biggest problems with switchable power components.

SUMMARY OF THE INVENTION

Accordingly, one object of this invention is to provide a novel high blocking-capacity semiconductor component, which exploits the advantages of a combination of barrier layer and emitter short-circuits without exhibiting the disadvantages of the known solutions.

The object is achieved in the case of a component of the above-mentioned type in the following way:

(d) the barrier layer in the form of separate barrier-layer regions only surrounds each of the p-type emitter regions, while the short circuit contact regions are completely set into the n-type base layer; so that (e) between each short-circuit contact region and each barrier-layer region an intermediate region is present, in which the n-type base layer meets the anode-side surface of the semiconductor substrate.

The essence of the invention can be explained as follows: the efficiency of emitter short-circuits is known to be determined by the strength of the forward-biasing of the emitter junction, caused by the current flowing via the short-circuit to the outer contact. This voltage drop is small and hence the short-circuit action large, if the electrical resistance of the short-circuit path (short-circuit resistance) is small, which is precisely what is achieved to an undesirable degree by the inclusion of a barrier layer.

In order not only to increase this resistance, but also to adjust its value in a controlled way, in accordance with the invention the barrier layer is applied not over the whole surface but only locally in front of the anode-side p-type emitter regions. In this region this additional doping prevents the electric field in blocking mode from being able to reach the emitter and trigger injection.

The other regions consist of either the highly doped short-circuit contact regions or the lightly-doped intermediate regions of the n-type base layer. The former represent a very sharp boundary for the electric field, while this latter in the intermediate region can reach as far as the component surface.

In accordance with a preferred exemplary embodiment of the invention (a) the anode-side surface of the semiconductor substrate is covered by an anode metallization; and (b) for electrical isolation from the n-type base layer and anode metallization the semiconductor substrate is covered on the anode side around each intermediate region with an insulating layer, and- /or the anode metallization around the intermediate regions is omitted.

The insulating layer between the anode metallization and the semiconductor substrate prevents currents in the area of the intermediate regions from flowing directly to the metallic contact. The field strengths occurring at this point can certainly be considerable, but at less than ca. $10^5$ V/cm they lie far below the breakdown field strength of for example $SiO_2$, with a value of greater than $10^6$ V/cm.

In the structure according to the invention the short-circuit resistance is essentially determined by the distance d between the local barrier-layer region and the n+ short-circuit contact region, as well as the specific resistance of the lightly-doped side of the PN-junction Thus the possibility arises, by means of an easily controlled, geometric quantity, of adjusting this resistance and hence the short-circuit action.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows the section through a GTO with barrier layer and emitter short-circuits according to the state of the art;

FIG. 2 shows in section the appropriate anode structure of a GTO according to a preferred exemplary embodiment of the invention;

DESCRIPTION OF THE PREFERRED EMBODIMENTS

Figures 3A, 3B:
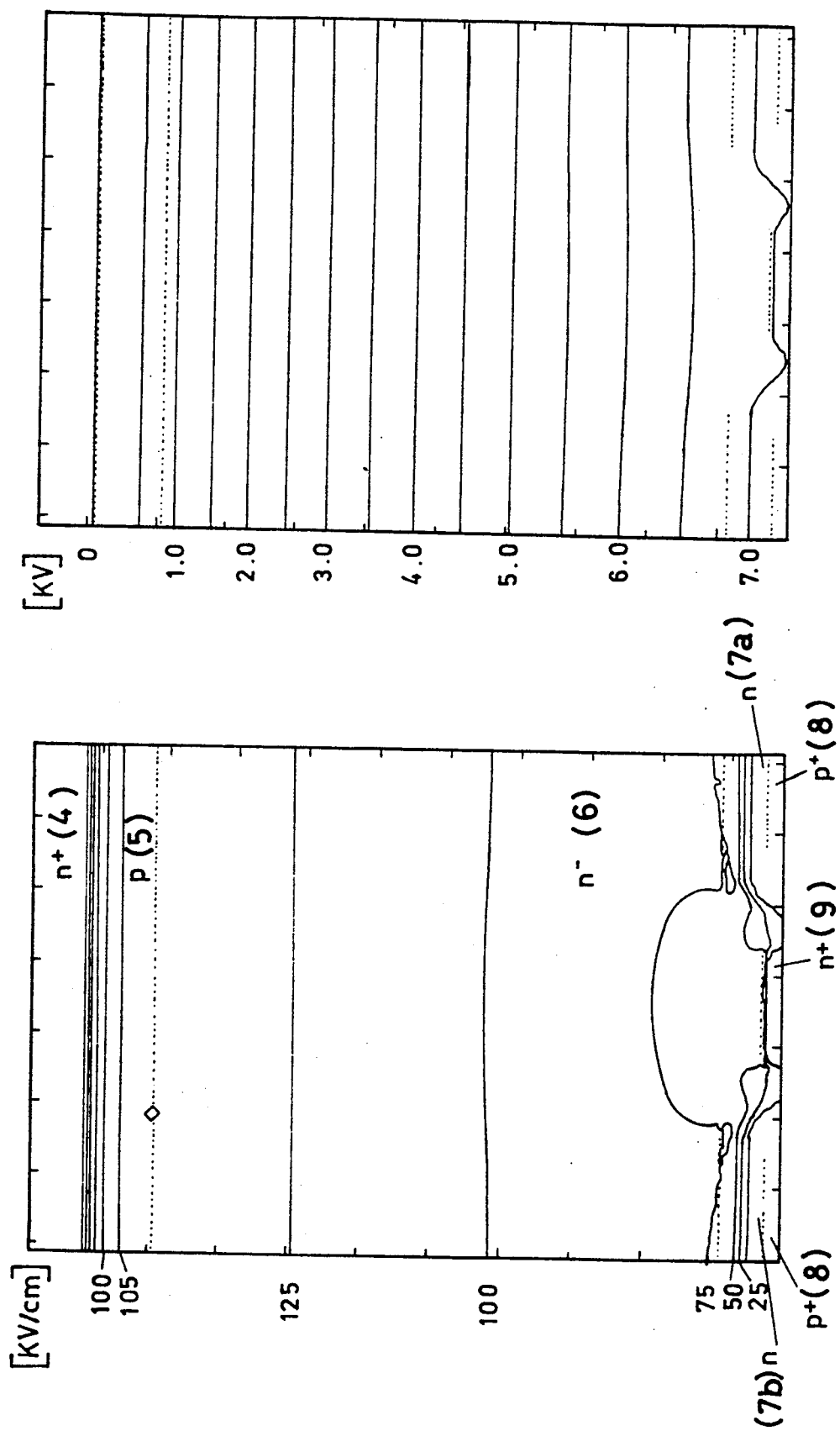
FIG. 3A shows the calculated field distribution in a structure according to FIG. 2.
FIG. 3B shows the calculated potential distribution in a structure according to FIG. 2.

In order to describe the invention the example of a gate turn-off thyristor (GTO) is henceforth to be used. Referring now to the drawings, wherein like reference numerals designate identical or corresponding parts throughout the several views, FIG. 1 represents the state-of-the-art structure of such a GTO which is equipped with a barrier layer and emitter short-circuits.

The exemplary GTO comprises a large-area semiconductor substrate 1, which on the one (lower) main surface is provided with an anode metallization 10 and on the other (upper) main surface with gate metallizations 3 and cathode metallizations 2. Corresponding to the metallizations 2, 3 and 10 are a cathode K, a gate G and an anode A as external contacts.

In the semiconductor substrate 1 there is arranged between the cathode K and the anode A a series of differently doped layers, which comprises n+-doped n-type emitter regions 4, a p-doped p-type base layer 5, an n-doped n-type base layer 6, an n-doped barrier layer 7 as well as within this barrier layer 7 p+-doped p-type emitter regions 8 and n+-doped short-circuit contact regions 9.

Between the p-type emitter regions 8 and the short-circuit contact regions 9 run each of the short-circuit paths, which are characterized by a short-circuit resistance $R_s$ (represented schematically in FIG. 1). Since the short-circuit paths run wholly in the higher n-doped barrier layer 7, the short-circuit resistance $R_s$ is comparatively small and the short-circuit action correspondingly large. As a result of this, the emitter efficiency of the p-type emitter regions 8 and hence the triggering sensitivity of the component are considerably reduced.

In order to obtain the field limiting action of the barrier layer without reduction of the emitter efficiency, according to the invention the continuous barrier layer is replaced by locally bounded barrier-layer regions. This results in an anode-side component configuration as shown in the exemplary embodiment of FIG. 2.

The barrier layer 7 therein consists of the separate barrier-layer regions 7a,b, which each surround the p-type emitter regions 8 but not the short-circuit contact regions 9. In this way there arise between the barrier-layer regions 7a,b and the short-circuit contact regions 9 intermediate regions 12 with the low n−-doping of the n-type base layer 6.

The short-circuit resistance $R_s$ is then determined definitively by means of the lateral distance d from barrier-layer region 7a,b to short-circuit contact region 9 and the relatively high specific resistance of the n-type base layer. Thus one not only achieves favorable resistance conditions in the short-circuit paths, but can also adjust by a simple means the short-circuit resistance $R_s$ within broad limits via the choice of the distance d.

The high specific resistance of the n-type base layer 6, however, only proves fully useful when in the intermediate regions 12 the surface of the semiconductor substrate 1 is electrically isolated from the anode metallization 10 by means of appropriate insulating layers 11, which consist for example of $SiO_2$. Alternative to, or in addition to, the insulating layers 11 the anode metallization 10 in the areas local to the intermediate regions can be omitted.

The short-circuit contact regions 9 and the p-type emitter regions 8 are preferably set into the semiconductor substrate 1 to a depth of about 20 μm. For the barrier-layer regions 7a,b a depth b of about 50 μm is preferred. The doping concentration at the surface of the barrier-layer regions 7a,b preferably has a value in that case of about $10^{16}$ cm$^{-3}$, while a specific resistance of the n-type base layer 6 of 500 Ohm cm has proved successful.

Taking as a basis an anode structure according to FIG. 2 with the preferred parameter values given above, the blocking behavior of a GTO at a voltage of 7 kV was calculated. The resulting distributions of the electric field and potential are given in FIG. 3A and 3B respectively (the scale division value in both figures is 70 μm horizontally and vertically/scale marking).

One sees immediately from FIG. 3A and B that the main objective of the field-limiting barrier-layer regions 7a,b, namely to prevent the breakthrough of the field as far as the p-type emitter regions 9, is fulfilled.

For the production of high blocking-capacity components the suggested anode structure presents no additional difficulty. The necessary masking during diffusion of the dopant for the barrier-layer regions 7a,b can be easily integrated into any process sequence.

Only the insulating layers 11 must be free from defects on the whole active surface. Defects can be tolerated if additionally the anode metallization 10 is omitted in these regions.

Although the invention is explained here using the example of a GTO, it can also be applied to other high blocking-capacity components in which a combination of barrier layer and emitter short-circuits is provided.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. High blocking-capacity semiconductor component, comprising:
   a semiconductor substrate with a first main surface on an anode-side and a second main surface on a cathode-side;
   an anode metallization provided on the first main surface and a gate and a cathode metallization provided on the second main surface;
   in the semiconductor substrate between an anode and a cathode, an n-type base layer, a plurality of p-type emitter regions on the anode-side and a barrier layer arranged between said n-type base layer and p-type emitter regions;
   a plurality of emitter short circuits with short-circuit contact regions, which are arranged between the p-type emitter regions; and
   the barrier layer comprising separate barrier layer regions which only surround each of the p-type emitter regions, while the short circuit contact regions are completely set into the p-type base layer;
   wherein between each short circuit contact region and each barrier layer region an intermediate region is present in which the n-type base layer meets the anode-side surface of the semiconductor substrate.

2. Component as claimed in claim 1, wherein for electrical isolation from the n-type base layer and anode metallization, the semiconductor substrate is covered on the anode side around each intermediate region with an insulating layer.

3. Component as claimed in claim 1, wherein for electrical isolation from the n-type base layer and anode metallization, the anode metallization around the intermediate regions is omitted.

4. Component as claimed in claim 2, wherein for electrical isolation from the n-type base layer and anode metallization, the anode metallization around the intermediate regions is omitted.

5. Component as claimed in claim 2, wherein the series of differently doped layers corresponds to that of a gate turn-off thyristor (GTO).

6. Component as claimed in claim 3, wherein the series of differently doped layers corresponds to that of a gate turn-off thyristor (GTO).

7. Component as claimed in claim 4, wherein the series of differently doped layers corresponds to that of a gate turn-off thyristor (GTO).

8. Component as claimed in claim 5, wherein
   (a) the barrier-layer regions exhibit a doping concentration at the surface of about $10^{16}\,cm^{-3}$;
   (b) the short-circuit contact regions and p-type emitter regions are set into the semiconductor substrate to a depth of about 20 μm; and
   (c) the barrier-layer regions are set into the semiconductor substrate to a depth of about 50 μm.

9. Component as claimed in claim 6, wherein
   (a) the barrier-layer regions exhibit a doping concentration at the surface of about $10^{16}\,cm^{-3}$;
   (b) the short-circuit contact regions and p-type emitter regions are set into the semiconductor substrate to a depth of about 20 μm; and
   (c) the barrier-layer regions are set into the semiconductor substrate to a depth of about 50 μm.

10. Component as claimed in claim 7, wherein
    (a) the barrier-layer regions exhibit a doping concentration at the surface of about $10^{16}\,cm^{-3}$;
    (b) the short-circuit contact regions and p-type emitter regions are set into the semiconductor substrate to a depth of about 20 μm; and
    (c) the barrier-layer regions are set into the semiconductor substrate to a depth of about 50 μm.

11. Component as claimed in claim 5, wherein the specific resistance of the n-type base layer has a value of about 500 Ohm cm.

12. Component as claimed in claim 6, wherein the specific resistance of the n-type base layer has a value of about 500 Ohm cm.

13. Component as claimed in claim 7, wherein the specific resistance of the n-type base layer has a value of about 500 Ohm cm.

14. Component as claimed in claim 1, wherein said barrier regions have a higher doping concentration than that of said n-type base layer.

15. Component as claimed in claim 2, wherein said barrier regions have a higher doping concentration than that of said n-type base layer.

16. Component as claimed in claim 3, wherein said barrier regions have a higher doping concentration than that of said n-type base layer.

17. Component as claimed in claim 4, wherein said barrier regions have a higher doping concentration than that of said n-type base layer.

18. Component as claimed in claim 7, wherein said barrier regions have a higher doping concentration than that of said n-type base layer.

19. Component as claimed in claim 10, wherein said barrier regions have a higher doping concentration than that of said n-type base layer.

20. Component as claimed in claim 13, wherein said barrier regions have a higher doping concentration than that of said n-type base layer.

* * * * *